United States Patent [19]
Giebel

[11] Patent Number: 6,093,949
[45] Date of Patent: Jul. 25, 2000

[54] MOS TRANSISTOR

[75] Inventor: Thomas Giebel, Dortmund, Germany

[73] Assignee: Elmos Semiconductor AG, Dortmund, Germany

[21] Appl. No.: 09/344,337

[22] Filed: Jun. 25, 1999

[30] Foreign Application Priority Data

Jun. 26, 1998 [DE] Germany .......................... 198 28 521

[51] Int. Cl.[7] ............................................ H01L 29/00
[52] U.S. Cl. ........................................ 257/345; 257/371
[58] Field of Search ................................. 257/344, 345, 257/349, 371

[56] References Cited

U.S. PATENT DOCUMENTS

| | | |
|---|---|---|
| 5,043,788 | 8/1991 | Omoto et al. . |
| 5,814,861 | 9/1998 | Schunke et al. . |
| 5,869,879 | 2/1999 | Fulford, Jr. et al. . |
| 5,905,292 | 5/1999 | Sugiura et al. . |

FOREIGN PATENT DOCUMENTS 536227 9/1994 Germany .

*Primary Examiner*—Stephen D. Meier

[57] ABSTRACT

An MOS transistor with high voltage sustaining capability and low closing resistance comprises a substrate (10) provided with a doping of a first conductive type, and a well area (20) formed in the substrate (10) and provided with a doping of a second conductive type opposite to the first conductive type. Further, the MOS transistor comprises source and drain areas (26,28) of the first conductive type formed in the well area (20). The MOS transistor is provided with a gate (32) comprising a gate oxide layer (36) and arranged between the source region (26) and the drain area (28), the gate (32) having drain-side end region (42) arranged at a distance (40) from the drain area (28). The MOS transistor comprises a drain extension region (24) provided with a doping of the first conductive type and having the drain area (28) arranged therein, with the drain extension region (24) reaching below the drain-side end region (42) of the gate (32). The drain extension region (24) is formed by ion implantation and comprises a first partial area (44) starting below the drain-side end region (42) of the gate (32) and extending in the direction of the drain area (28), and a second partial area (38) joining the first partial area (44) in the direction of the drain area (28) arranged therein or having the drain area (28) bordering thereon, with the concentration of the electrically active doping of the first conductive type being larger in the second partial area (38) than in the first partial area (44) of the drain extension region. The well area (20) is formed by ion implantation of two partial areas (16,18) spaced from each other by a distance region (14) aligned with the second partial area (38), and by subsequent thermally induced diffusion, wherein these two partial areas (16,18) after diffusion are connected to each other within a connection region (22) corresponding to the second partial area (38) of the drain extension region (24), and the concentration of the doping of the second conductive type is lower in this connection region (22) than in the rest of the well area (20).

4 Claims, 2 Drawing Sheets

MOS TRANSISTOR

BACKGROUND OF THE INVENTION

The present invention relates to a MOS transistor with high voltage sustaining capability and low closing resistance. Particularly, the invention relates to a PMOS transistor having a high voltage sustaining capability with low closing resistance.

A high-voltage transistor with a breakthrough voltage of about 44 V is disclosed in EP-A-91 911 911. Particularly in the automotive region, however, increased demands are posed to the voltage sustaining capability. Thus, for instance, it is desirable that the PMOS transistor has a voltage sustaining capability of >60, preferably about 80 V, with the additional demand that the closing resistance of this transistor is relatively low.

For the voltage sustaining capability of MOS transistors, it is required that the electric field between the drain-side gate edge and the drain is decreased and the strength of the electric field on the drain-side gate edge is reduced. In principle, this can be achieved in that the drain is arranged at a distance from the drain-side gate edge, and in that a so-called drain extension region is arranged between the drain area and the gate, with the drain extension region having a lower concentration of charge carriers. The drain extension region is located around the drain area so that the latter is arranged with in the former.

Such a drain extension region makes it possible, due to the relatively low concentration of charge carriers, to sufficiently decrease the electric field between the drain and the drain-side gate edge and to reduce the strength of the electric field on the gate edge to a sufficient extent. However, in such a transistor design, the closing resistance will increase. This closing resistance can be lowered if one succeeds in gradually increasing the charge carrier concentration in the drain extension region. An example of such a MOS transistor with laterally modulated drain extension region is known from WO-A 97/13277. Said document discloses the lateral modulation of the doping material concentration in the drain extension region by insertion of an n-ion implantation while masking at least one distance region, wherein the implantation areas separated after ion implantation will "flow into each other" by subsequent thermally induced diffusion. In these regions, the doping material concentration will thus be reduced.

If, one the other hand, the generation of the drain extension region has to be performed while only one ion implantation without subsequent thermally induced diffusion is available, the measures indicated in the above mentioned PCT document are not suited to realize a lateral modulation in the ion-implanted drain extension region. As an alternative, the drain extension region could be generated by introducing a plurality of ion implantations with different energies. This, however, would require additional process steps with their inherent disadvantages.

It is an object of the invention to provide a MOS transistor with high voltage sustaining capability and low closing resistance, with the drain extension region of the transistor being ion-implanted, wherein the ion implantation step for generating the drain extension region shall remain unchanged.

SUMMARY OF THE INVENTION

To fulfill the above object, the present invention provides an MOS transistor with high voltage sustaining capability and low closing resistance comprising:

a substrate comprising a doping of a first conductive type, a well area formed in the substrate and provided with a doping of a second conductive type opposite to the first conductive type, source and drain areas of the first conductive type formed in the well area, a gate comprising a gate oxide layer and arranged between the source region and the drain area, the gate having drain-side end region arranged at a distance from the drain area, and a drain extension region comprising a doping of the first conductive type and having the drain area arranged therein, with the drain extension region reaching below the drain-side end region of the gate.

According to the instant invention, it is provided in the above MOS transistor that the drain extension region is formed by ion implantation and comprises a first partial area starting below the drain-side end region of the gate and extending in the direction of the drain area, and a second partial area joining the first partial area in the direction of the drain area and having at least a partial area of the drain area arranged therein or having the drain area bordering thereon, with the concentration of the electrically active doping of the first conductive type being larger in the second partial area than in the first partial area of the drain extension region, and that the well area is formed by ion implantation of two partial areas spaced from each other by a distance region aligned with the second partial area, and by subsequent thermally induced diffusion, wherein these two partial areas after diffusion are connected to each other within a connection region corresponding to the second partial area of the drain extension region, and the concentration of the doping of the second conductive type is lower in this connection region than in the rest of the wall area.

In the MOS transistor of the invention, which is realized particularly in the form of a PMOS transistor, the n-ion implantation required for the generation of the n-well area is masked in a distance region. This distance region lies within the drain extension region and is spaced from the drain-side gate edge. The later drain area is arranged within this distance region or projects at least partially into the distance region.

By the masking performed in n-ion implantation, two mutually separated n-ion implantation areas are generated in the p-substrate which during the subsequent thermally induced diffusion will "flow into each other" and thus will be connected to each other. In the resultant connection region which is flush with the distance region, the n-well area has a lower concentration of n-doping, e.g. phosphorus doping. When a p-ion implantation is introduced into the thus prepared region of the n-well area, with the implantation areas extending beyond the connection region on the two opposite sides, this p-ion implantation area will have an increased concentration of active p-doping material within the connection region because of the lower concentration of n-doping material therein. On the other hand, the concentration of p-doping material is lower in the adjacent regions on both sides of the connection region since the n-area has a higher doping material concentration. In this manner, there is generated a laterally modulated ion implantation area which because of its modulation of the doping material concentration is suited as a drain extension region to fulfill the above requirements. The position of this drain extension region within the n-well area is selected such that a first partial area of the drain extension region which is located outside the connection region, is arranged to extend to a position below the drain-side edge, whereas the second drain extension partial area wherein the p-doping material concentration is increased, has at least part of and preferably all of the drain area arranged therein.

Thus, eventually, by performing a masking step during the generation of the n-well area, one has provided suitable conditions to the effect that the drain extension region, although generated by an ion implantation remaining unchanged over the whole area, is given a lateral doping material concentration profile. This profile is configured such that the doping material concentration in the region bordering on the drain-side gate edge is reduced and is increased in the adjoining region towards the drain area. Therefore, the thus produced MOS transistor on the one hand has a relatively high voltage sustaining capability since the electric field has been reduced towards the drain-side edge and the electric field strength at the gate is relatively low, while, on the other hand, the closing resistance is increased because of the higher doping material concentration in the drain extension region adjacent the drain area.

Thus, the invention MOS transistor can be produced by a conventional CMOS process wherein voltage sustaining capabilities of >60 V $U_{PS}$ up to 80 V $U_{PS}$ can be realized at a low area-related closing resistance.

A further—although not excessively strong—increase of the voltage sustaining capability can be obtained in that the ion implantation for setting the threshold voltage of the MOS transistor is introduced into the drain extension region. In doing so, however, care must bet taken that this threshold voltage implantation is masked on the drain-side gate edge to avoid that the charge carrier concentration is increased in that region by the additional implantation. The additionally introduced threshold voltage implantation increases the voltage sustaining capability and also reduces—although only slightly so—the area-related closing resistance.

To sum up, a considerable problem of known HV transistors is to be seen in the high doping of the drain extension, particularly is case of flat drain extension implantation (e.g. 180 kV, 3E12) in connection with the high electric field on the drain-side gate edge. Thus, the doping and the electric field have to be reduced in this region.

The novel concept to overcome these problems allows for a lateral modelling of the doping material concentration in the drift distance. Thus, the doping material concentration in the region of the high electric field on the drain-side gate edge can be kept low so that the breakthrough voltage is kept him, while the doping material concentration in the drift distance to the p+ drain connection region increases so that the conductivity of the region becomes larger.

To this end, the well implantation in the region of the transition from the p+ drain connection region to the drift distance is masked so that, after diffusion of the well, the phosphorus concentration is lowered in this region. Thus, in this region, the electrically active boron concentration of the drift distance is increased so that the conductivity becomes larger. In the lateral direction to the drain-side gate edge, the phosphorus concentration increases because of the diffusion of the well implantation, and the electrically active boron concentration decreases. Thereby, it is safeguarded that in this critical region the p-n junction is largely smooth so that the electric field remains sufficiently small.

For the drain extension in the novel PMOS, use is made of the NMOS threshold implantation which in the LOCOS process is of a two-part structure. Normally, a deep high-energy implantation with boron is used for setting the field threshold voltage in the NMOS region, and the low-energy implantation is used for setting the threshold voltage of the NMOS transistors. Within the n-well, this dual implantation generates, within an active region, a p-region which under the aspects of depth and profile is well suited as a drain extension.

This drain extension should overlap the later generated gate by 1 µm for channel connection. The p+ drain connection region must have a distance both from the drain-side gate edge and from the edge of the active region since, otherwise, critical field strength peaks would be generated on both sites.

The above has been the classical approach making advantageous use of existing process steps.

The very flat boron implantation used for setting the PMOS threshold voltage has to be masked in the region of the drain-side gate edge. Thereby, the boron concentration in this region is lowered, the space charge zone in this region can further expand and the electric field is thus weakened, resulting in a further increase of the threshold voltage.

To reduce the on-resistance of the transistor in the conductive state, either the doping material concentration of the drain extension can be increased or the drift distance can be shortened. Both approaches will however result in lower breakthrough voltages since they cause an increase in the field strength of the drain-side gate edge. It would be better if the electrically active doping material concentration and thus the conductivity would increase from the drain-side gate edge to the p+ drain area in the lateral direction. This allows for a good potential distribution in the critical region and generally low-ohmic connection of the p+ drain area. Normally, this can be accomplished only by an additional diffusion step in the process, which due to the far-reaching consequences for the overall process and for all other components is forbidding. Since, however, in this region, the electrically active doping of two doping materials, i.e. boron and phosphorus, is determined, it is possible to increase the electrically active boron concentration by reducing the phosphorus concentration. For this purpose, the well implantation in the region of the p+ drain area is masked. By the after-diffusion, the two well portions will again be connected by diffusion, resulting a reduced phosphorus concentration in this region. Thus, in the subsequent boron implantation, the electrically active doping and thus the conductivity of the drift distance will increase by exactly that amount by which the phosphorus concentration has been lowered.

Since, under the influence of the diffusion, the phosphorus concentration on the surface will slowly decrease laterally from the normal concentrations to a minimum in the center of the masked zone, one will thus reach a lateral modulation of the electrically active boron doping in the drift distance which is perfectly compliant with the requirements.

The sequence of an example of the production process for an inventive MOS transistor realized as a PMOS transistor is as follows:

Process sequence:
    Starting material: p-silicon Epi
    Well implantation using phosphorous with well gap
    after-diffusion and field oxidation LOCOS
    threshold and field threshold implantation NMOS (for the drift distance/drain extension)
    threshold implantation PMOS with masking at the later drain-side gate edge
    Polydeposition and gate structuring
    p+ implantation PMOS drain/source (at the drain side at a distance to gate and active area edge)
    Intermediate oxide
    Contact holes
    Metallization

BRIEF DESCRIPTION OF THE DRAWINGS

A preferred embodiment of the invention will be described in greater detail hereunder with reference to the drawings.

DETAILED DESCRIPTION OF A PREFERRED EMBODIMENT

Figure 1:
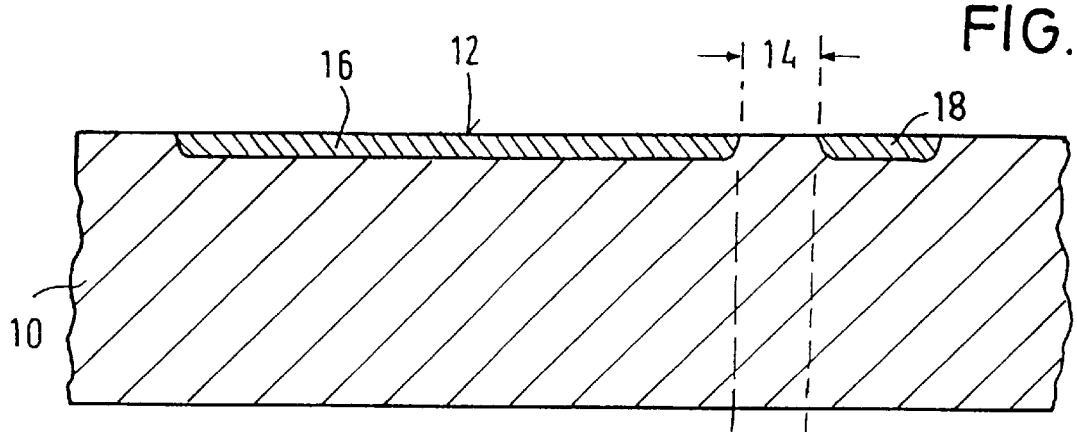
FIGS. 1 to 3 are cross-sectional views of the region of a p-substrate near the surface thereof in different phases of the production process for a PMOS transistor with voltage sustaining capability and low closing resistance.
Figure 2:
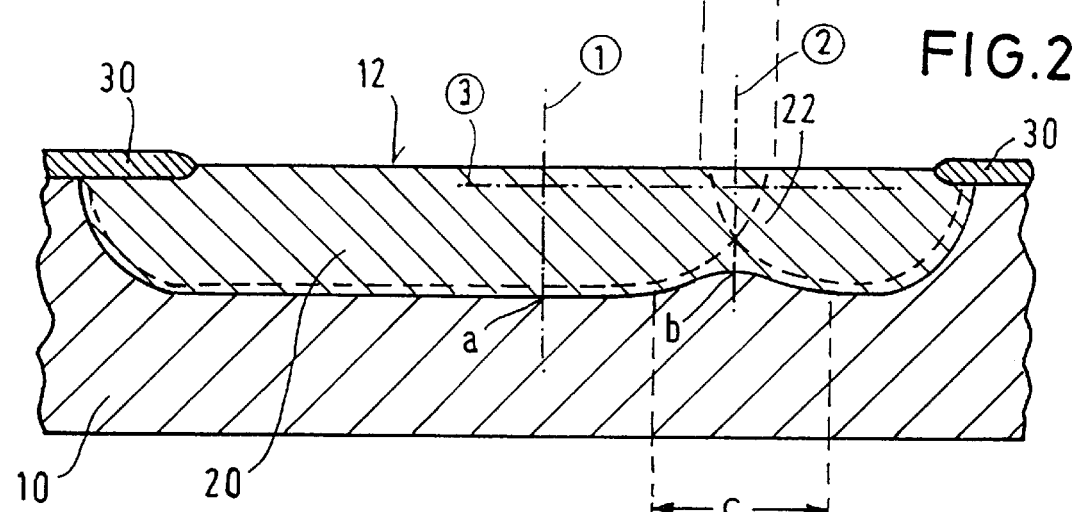
Figure 4:
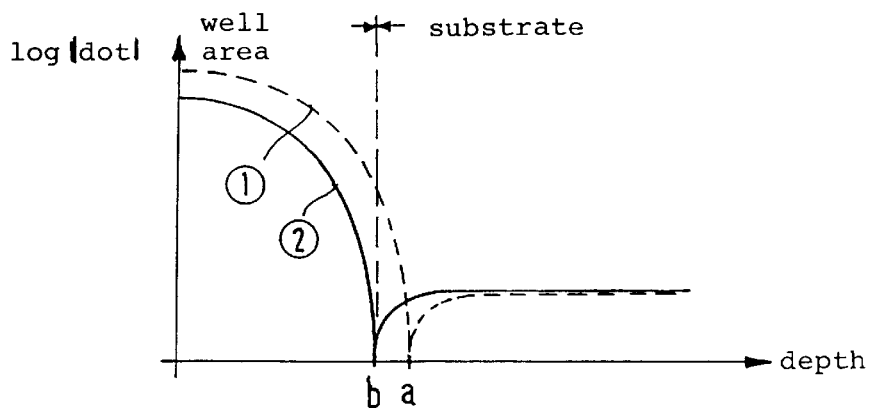
FIGS. 4 to 6 are diagrams of the developments of the doping material concentration on the points of the p-substrate indicated more exactly in FIGS. 2 and 3.

FIG. 1 shows a p-substrate 10 with two n-ion implantation areas 16,18, spaced from each other by a distance region 14, introduced into the surface 12 of said areas. In the subsequent thermally induced diffusion, the two areas 16,18 will flow together to form the n-well area 20 as shown in FIG. 2. In the connection region 22 corresponding to distance region 14, a reduced depth of n-well area 20 as well as a reduced phosphorus doping material concentration will be generated in the process. This is evident from the two curves in FIG. 4 and from curve 3 in FIG. 5. In FIG. 4, the doping material concentration profile resulting in the depth direction of n-well 20 outside connection region 22 is indicated by curve 1 as the amount of the doping material concentration. Starting from the doping material concentration on the surface 12 of p-substrate 10, the concentration decreases towards the bottom of n-well area 20 (p-n junction a of FIG. 2) and then, with increasing progress into the depth of the p-substrate 10, takes on the doping material concentration of the latter.

The situation according to curve 2 of FIG. 4 is different. Starting from a doping material concentration value on substrate surface 12 which is below the value according to curve 1, the doping material concentration decreases towards the p-n junction b located above p-n junction a, and then, with increasing progress into the depth of the p-substrate 10, takes on the doping material concentration of the latter.

Figure 5:
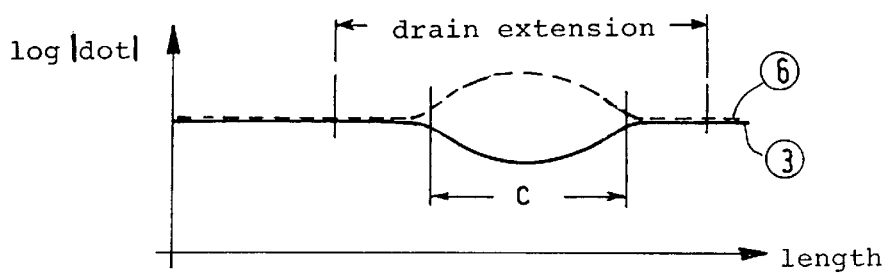

The situation in the lateral direction is shown by curve 3 in FIG. 5. In the connection region 22 and on both sides thereof (indicated by c in FIGS. 2 and 5), the resultant doping material concentration is lower than in the remaining region of n-well area 20.

Figure 3:
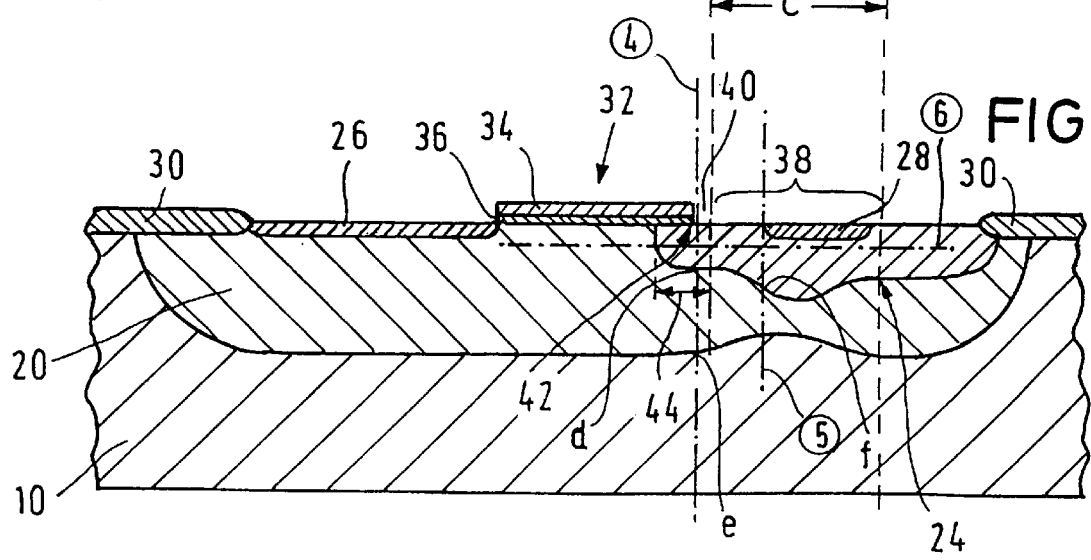
Figure 6:
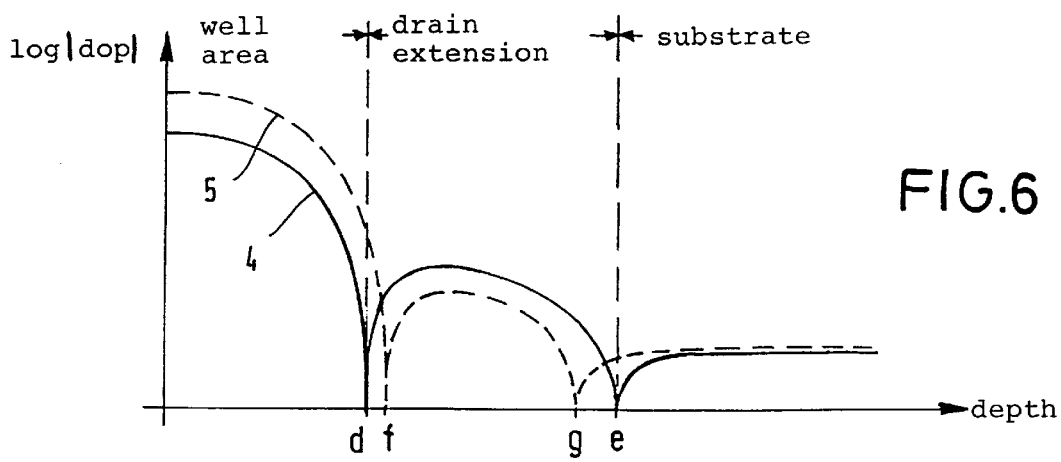

FIG. 3 shows the situation after insertion of the ion implantation for the drain extension region 24 as well as after formation of the source and drain areas 26,28 and of the field oxide 30 as well as of the gate 32 comprising a gate electrode 34 and the thin gate oxide 36. Because of the lateral doping material concentration profile of n-well 20 in the region c, the drain extension region 24, which is formed by a p-boron ion implantation that is constant over the whole extension, has an increased concentration of electrically conductive doping material in the region c. This partial area 38 wherein the drain area 28 is formed, is distanced from the drain-side gate edge 42 by a distance region 40. In the direction towards gate 32, the drain extension partial area 38 is joined by a partial area 44 reaching to a point below the drain-side gate edge 42. Thus, in this partial area 44, the drain extension region 24 has a lower doping material concentration than in the partial area 38. Also this situation is shown in FIG. 5, curve 6. Curve 6 shown the development of the doping material concentration in the lateral dimension within drain extension region 24. The doping material concentration profiles generated in the depth within the two partial areas 38 and 44 are shown by the curves 5 and 4 in FIG. 6. The p-n junctions between drain extension region 24 and n-well area 20 as well as between n-well area 20 and p-substrate 10 are shown at d and e and respectively f and g in FIGS. 3 and 6.

Figure 7:
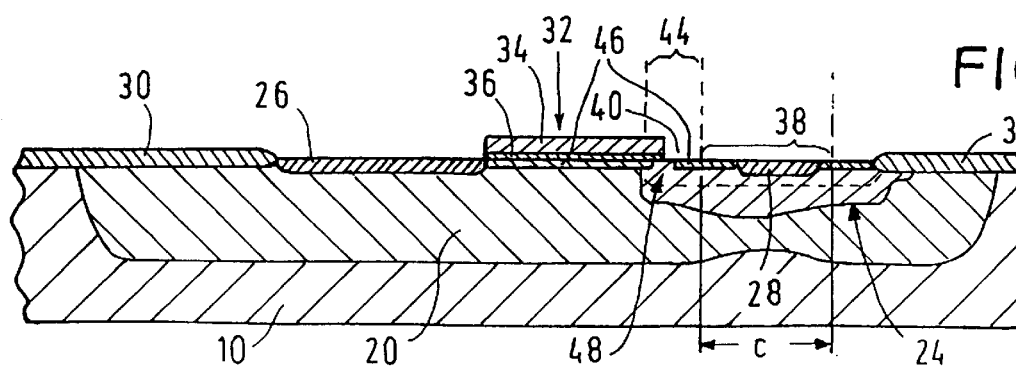
FIG. 7 is a cross-sectional view of a PMOS transistor similar to the transistor according to FIG. 3 but additionally provided with a threshold voltage implantation.

FIG. 7 shows the PMOS transistor according to FIG. 3 with an additionally introduced threshold voltage ion implantation 46, with this implantation 46, with this implantation 46 being masked around the drain-side gate edge 42.

What is claimed is:

1. An MOS transistor with high voltage sustaining capability and low closing resistance comprising:

a substrate comprising a doping of a first conductive type, a well area formed in the substrate and provided with a doping of a second conductive type opposite to the first conductive type, source and drain areas of the first conductive type formed in the well area, a gate comprising a gate oxide layer and arranged between the source region and the drain area, the gate having drain-side end region arranged at a distance from the drain area, and a drain extension region comprising a doping of the first conductive type and having the drain area arranged therein, with the drain extension region reaching below the drain-side end region of the gate, wherein the drain extension region is formed by ion implantation and comprises a first partial area starting below the drain-side end region of the gate and extending in the direction of the drain area, and a second partial area joining the first partial area in the direction of the drain area and having at least a partial area of the drain area arranged therein or having the drain area bordering thereon, with the concentration of the electrically active doping of the first conductive type being larger in the second partial area than in the first partial area of the drain extension region, and the well area is formed by ion implantation of two partial areas spaced from each other by a distance region aligned with the second partial area, and by subsequent thermally induced diffusion, wherein these two partial areas after diffusion are connected to each other within a connection region corresponding to the second partial area of the drain extension region, and the concentration of the doping of the second conductive type is lower in this connection region than in the rest of the well area.

2. The MOS transistor according to claim 1, wherein a threshold voltage ion implantation for setting the threshold voltage is formed below the gate except for the drain-side end region of the threshold voltage ion implantation.

3. The MOS transistor according to claim 2, wherein the threshold voltage ion implantation is introduced also in the drain extension region.

4. The MOS transistor according to claim 1, wherein the doping of the first conductive type is a p-doping and the doping of the second conductive type is an n-doping.

* * * * *